United States Patent
Kim et al.

(10) Patent No.: US 10,284,156 B2
(45) Date of Patent: May 7, 2019

(54) AMPLIFIER AND SEMICONDUCTOR APPARATUS USING THE SAME

(71) Applicant: SK hynix Inc., Icheon-si, Gyeonggi-do (KR)

(72) Inventors: Dong Hyun Kim, Icheon-si (KR); Eun Ji Choi, Icheon-si (KR); Yo Han Jeong, Seoul (KR); Soon Ku Kang, Icheon-si (KR); Woo Jin Kang, Icheon-si (KR); Kwan Su Shon, Guri-si (KR); Hyun Bae Lee, Icheon-si (KR); Tae Jin Hwang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 21 days.

(21) Appl. No.: 15/668,097

(22) Filed: Aug. 3, 2017

(65) Prior Publication Data
US 2018/0294784 A1 Oct. 11, 2018

(30) Foreign Application Priority Data
Apr. 10, 2017 (KR) .................. 10-2017-0045944

(51) Int. Cl.
| | |
|---|---|
| H03F 3/45 | (2006.01) |
| G05F 1/565 | (2006.01) |
| H03M 1/00 | (2006.01) |

(52) U.S. Cl.
CPC ......... *H03F 3/45076* (2013.01); *G05F 1/565* (2013.01); *H03F 3/4565* (2013.01); *H03F 3/45183* (2013.01); *H03F 3/45488* (2013.01); *H03F 3/45748* (2013.01); *H03M 1/00* (2013.01); *H03F 2200/453* (2013.01); *H03F 2203/45008* (2013.01); *H03F 2203/45418* (2013.01)

(58) Field of Classification Search
CPC ............ H03F 3/45076; H03F 3/45488; H03F 3/45748; H03F 3/45475; H03F 3/45183; H03F 3/45479; H03F 3/45071; H03F 1/34; H03F 3/45659; H03F 3/4565; H03F 1/3211; H03F 3/45; G05F 1/565
USPC .......................................... 330/258, 259.26
See application file for complete search history.

(56) References Cited

U.S. PATENT DOCUMENTS

| | | | | |
|---|---|---|---|---|
| 2005/0174174 | A1 | 8/2005 | Lim | |
| 2009/0251216 | A1* | 10/2009 | Giotta | H03F 3/45179 330/258 |
| 2009/0295479 | A1* | 12/2009 | Sunairi | H03F 3/45183 330/253 |
| 2012/0299758 | A1* | 11/2012 | Hwang | H03M 1/1225 341/110 |
| 2013/0194039 | A1* | 8/2013 | Hirose | H03F 3/45179 330/253 |

* cited by examiner

Primary Examiner — Khanh V Nguyen
(74) Attorney, Agent, or Firm — William Park & Associates Ltd.

(57) ABSTRACT

An amplifier may include a differential pair circuit configured to generate an output signal according to a first input signal and a second input signal, a plurality of current sinks coupled between a ground terminal and the differential pair circuit, and a feedback circuit configured to sense a level of the output signal and generate a feedback signal. At least one of the plurality of current sinks is controlled according to the feedback signal.

16 Claims, 4 Drawing Sheets

& # x20;# AMPLIFIER AND SEMICONDUCTOR APPARATUS USING THE SAME

CROSS-REFERENCES TO RELATED APPLICATION

The present application claims priority under 35 U.S.C. § 119(a) to Korean application number 10-2017-0045944, filed on Apr. 10, 2017, in the Korean Intellectual Property Office, which is incorporated herein by reference in its entirety.

BACKGROUND

1. Technical Field

Various embodiments generally relate to a semiconductor circuit, and, more particularly, to an amplifier and a semiconductor apparatus using the same.

2. Related Art

A semiconductor apparatus may include an amplifier configured to amplify an input signal to a level which is recognizable in the semiconductor apparatus.

The amplifier may be applied to a buffer, e.g., an input/output buffer, and generate an output signal by amplifying differential signals (hereinafter, referred to as differential input signals) having opposite phases or pseudo-differential signals (hereinafter, referred to as pseudo-differential input signals) one of which has a fixed level, and the other of which varies in level.

As such, because the amplifier operates using differential input signals or pseudo-differential input signals, a common-mode range, a common-mode rejection ratio (CMRR), and the like may function as important factors which influence the performance of the amplifier.

SUMMARY

Various embodiments are directed to an amplifier having improved operational performance, and a semiconductor apparatus using the same.

In an embodiment, an amplifier may include: a differential pair circuit configured to generate an output signal according to a first input signal and a second input signal; a plurality of current sinks coupled between a ground terminal and the differential pair circuit; and a feedback circuit configured to sense a level of the output signal and generate a feedback signal. At least one of the plurality of current sinks may be controlled according to the feedback signal.

In an embodiment, a semiconductor apparatus may include: a plurality of data input/output terminals; a plurality of buffers coupled to the respective data input/output terminals; and a feedback circuit configured to sense a level of any one output signal of the plurality of buffers and generate a feedback signal. At least one of a plurality of current sinks of each of the plurality of buffers may be controlled according to the feedback signal.

DETAILED DESCRIPTION

Hereinafter, an embodiment of the present disclosure will be described in detail with reference to the accompanying drawings.

Figure 1:
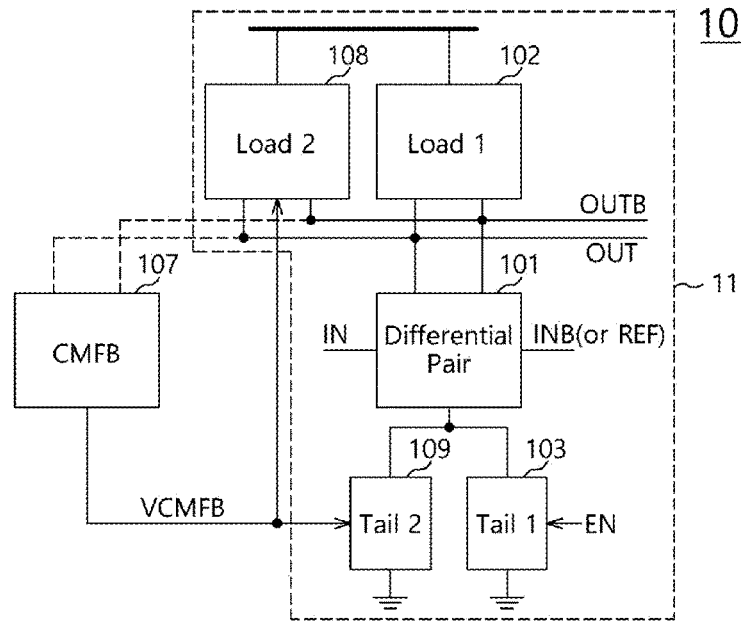
FIG. 1 is a diagram illustrating a configuration of an amplifier 10 in accordance with an embodiment.

As shown in FIG. 1, an amplifier 10 in accordance with an embodiment may include an amplifier circuit 11 and a feedback circuit (CMFB) 107.

The amplifier circuit 11 may include a differential pair circuit (Differential Pair) 101, a first load (Load 1) 102, a second load (Load 2) 108, a first current sink (Tail 1) 103, and a second current sink (Tail 2) 109.

The differential pair circuit 101 may generate at least one of a first output signal OUT and a second output signal OUTB according to at least one of a first input signal IN and a second input signal INB or REF.

The amplifier 10 in accordance with an embodiment may have, depending on an input signal, any one of a differential type configuration and a pseudo-differential type configuration, which are different from each other.

For example, in the case where the second input signal is a signal INB which has a phase which varies opposite to that of the first input signal IN, the amplifier 10 may have a differential type configuration.

In the case where the second input signal INB is a reference voltage REF which is fixed at a constant level, the amplifier 10 may have a pseudo-differential type configuration.

The first load 102 and the second load 108 may be coupled in parallel with each other between a power supply terminal and the differential pair circuit 101.

The first current sink 103 and the second current sink 109 that are coupled between a ground terminal and the differential pair circuit 101 may be coupled in parallel with each other.

The first current sink 109 may be enabled according to an enable signal EN.

The enable signal EN may have a fixed voltage level, e.g., the same voltage level as that of a power supply voltage level VDD. Thus, any one of the plurality of current sinks 103 and 109 may be controlled according to a voltage having a fixed level when the amplifier 10 is enabled.

A current driving force of at least one of the second load 108 and the second current sink 109 may be adjusted according to a feedback signal VCMFB.

The feedback circuit 107 may be designed to operate in a common-mode feedback manner.

The feedback circuit 107 may sense any one level of the first and second output signals OUT and OUTB and change the voltage level of the feedback signal VCMFB, and the feedback circuit 107 generates the feedback signal VCMFB.

The feedback circuit 107 may be designed such that it is operated in a different manner depending on whether the amplifier 10 has a differential type configuration or a pseudo-differential type configuration.

In an embodiment, the current driving force of the second current sink 109 and the current driving force of the second load 108 are also adjusted to correspond to an output voltage, whereby a loss of a common-mode rejection ratio (CMRR) may be reduced, and a low-voltage operation is possible.

The feedback circuit 107 may directly or indirectly sense, depending on whether the amplifier 10 has a differential type configuration or a pseudo-differential type configuration, the level of any one of the first and second output signals OUT and OUTB, e.g., the level of the first output signal OUT, and thus change the voltage level of the feedback signal VCMFB. This operation will be described with reference to FIGS. 2 to 5.

Figure 2:
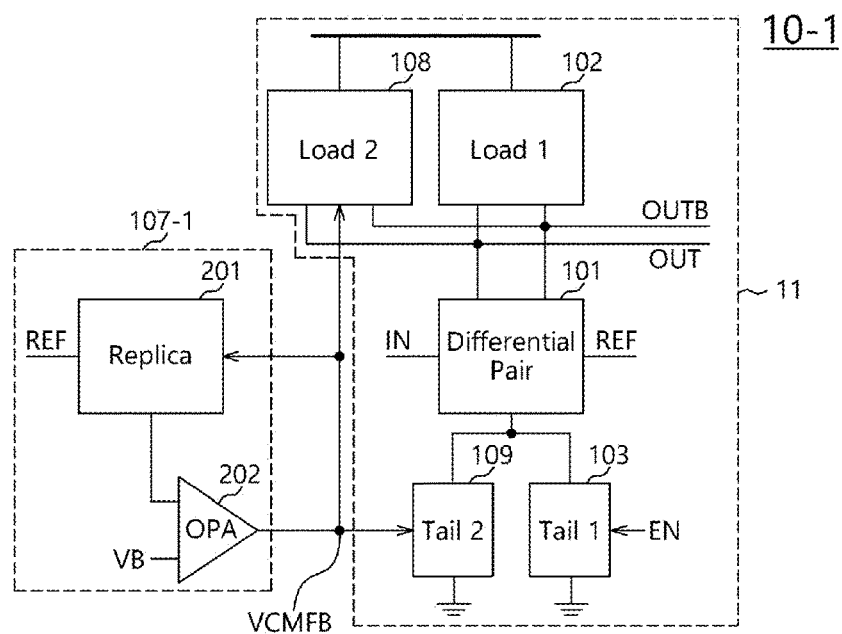
FIG. 2 is a diagram illustrating a configuration of a pseudo-differential amplifier 10-1 in accordance with an embodiment.

As shown in FIG. 2, a pseudo-differential amplifier 10-1 in accordance with an embodiment may include an amplifier circuit 11 and a feedback circuit 107-1.

The amplifier circuit 11 may have the same configuration as that of FIG. 1.

The feedback circuit 107-1 may be configured to indirectly sense the level of the first output signal OUT and change the voltage level of the feedback signal VCMFB.

The feedback circuit 107-1 may include a replica circuit 201 and an operational amplifier (OPA) 202.

Here, there is described an example in which the output of the replica circuit 201 may be directly used to communicate a feedback signal VCMFB, and the operational amplifier 202 is additionally used to stabilize the feedback signal VCMFB.

The replica circuit 201 may be configured by replicating the amplifier circuit 11.

The operational amplifier 202 may generate a feedback signal VCMFB by amplifying the output voltage of the replica circuit 201 according to a bias voltage VB.

Figure 3:
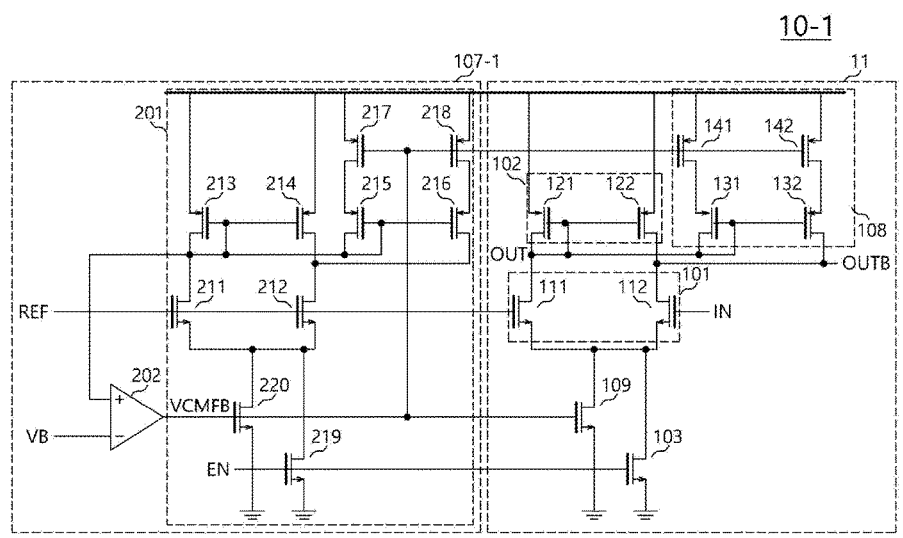
FIG. 3 is a diagram illustrating an example of a circuit configuration of the amplifier 10-1 of FIG. 2.

The pseudo-differential amplifier 10-1 may have a circuit configuration, as shown in FIG. 3.

The differential pair circuit 101 may include a first transistor 111 and a second transistor 112.

The first transistor 111 may receive the second input signal, i.e., the reference voltage REF, through a gate terminal thereof.

The second transistor 112 may receive the first input signal IN through a gate terminal thereof.

The first load 102 may include a third transistor 121 and a fourth transistor 122.

In the third transistor 121, a source terminal thereof may be coupled with the power supply terminal, and a drain terminal thereof may be coupled with a source terminal of the first transistor 111.

In the fourth transistor 122, a source terminal thereof may be coupled with the power supply terminal, and a drain terminal thereof may be coupled with a source terminal of the second transistor 112.

Gate terminals of the third and fourth transistors 121 and 122 may be coupled in common with a first output signal (OUT) terminal.

The second load 108 may further include fifth to eighth transistors 131, 132, 141, and 142.

The fifth and sixth transistors 131 and 132 may be configured to operate as a load.

The fifth and sixth transistors 131 and 132 may be coupled with the first transistor 111 and the second transistor 112 in parallel with the third transistor 121 and the fourth transistor 122.

The seventh and eighth transistors 141 and 142 may be configured to form a current path from the power supply terminal to the fifth and sixth transistors 131 and 132 according to a feedback signal VCMFB.

The first current sink 103 may be formed of a transistor which is coupled between the ground terminal and the differential pair circuit 101 and is enabled in response to an enable signal EN.

The second current sink 109 may be formed of a transistor which is coupled in parallel with the first current sink 103 between the ground terminal and the differential pair circuit 101 and is operated in response to a feedback signal VCMFB.

Here, the transistors constituting the first load 102 may be designed to differ in size from the transistors constituting the second load 108, whereby fundamental current driving forces thereof may be set to different values, and the current driving force of the second load 108 may be additionally adjusted in response to a feedback signal VCMFB.

The first current sink 103 and the second current sink 109 may also be designed to differ from each other in size of the transistors thereof, whereby fundamental current driving forces thereof may be set to different values, and the current driving force of the second current sink 109 may be additionally adjusted in response to a feedback signal VCMFB.

The replica circuit 201 may include a plurality of transistors 211 to 220. Because the replica circuit 201 has a configuration formed by replicating the amplifier circuit 11, a coupling configuration of the plurality of transistors 211 to 220 may be the same as that of the amplifier circuit 11.

Because the replica circuit 201 is operated through current mirroring, i.e., with the same amount of current as that of the amplifier circuit 11, the level of the output voltage thereof may be the same as the voltage of the output signal of the amplifier circuit 11.

The operational amplifier 202 may generate a feedback signal VCMFB by amplifying the output voltage of the replica circuit 201 according to a bias voltage VB.

Figure 4:
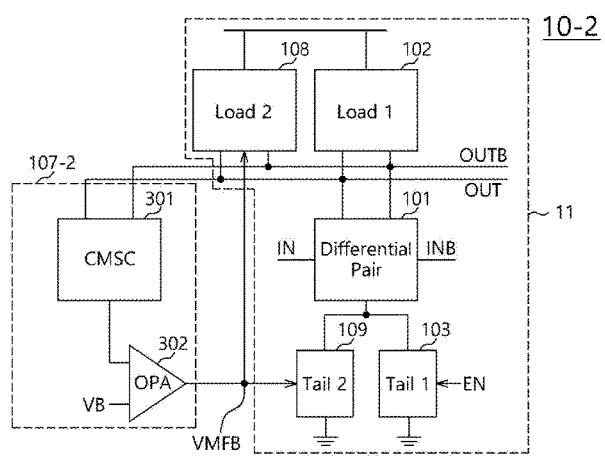
FIG. 4 is a diagram illustrating a configuration of a differential amplifier 10-2 in accordance with an embodiment.

As shown in FIG. 4, a differential amplifier 10-2 in accordance with an embodiment may include an amplifier circuit 11 and a feedback circuit 107-2.

The amplifier circuit 11 may have the same configuration as that of FIG. 1.

The feedback circuit 107-2 may be configured to directly sense the level of the first output signal OUT and change the voltage level of the feedback signal VCMFB.

The feedback circuit 107-2 may include a sensing circuit (CMSC) 301 and an operational amplifier 302.

Here, there is described an example in which the output of the sensing circuit 301 may be directly used as a feedback signal VCMFB, and the operational amplifier 302 may be additionally used to stabilize the feedback signal VCMFB.

The sensing circuit 301 may detect an intermediate voltage level between the first output signal OUT and the second output signal OUTB and output the detected intermediate voltage level.

The operational amplifier 302 may generate a feedback signal VCMFB by amplifying the output voltage of the sensing circuit 301 according to a bias voltage VB.

Figure 5:
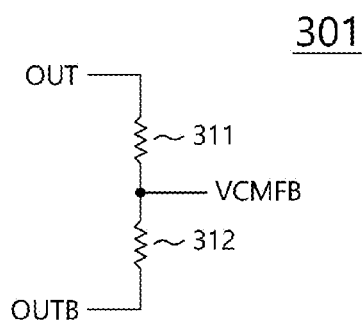
FIG. 5 is a diagram illustrating an example of a configuration of a common-mode sensing circuit 301 of FIG. 4.

As shown in FIG. 5, the sensing circuit 301 may include distribution resistances 311 and 312.

The distribution resistances 311 and 312 may receive a first output signal OUT on one end thereof and receive a second output signal OUTB on the other end thereof, and may output, through a coupling node therebetween, an intermediate voltage level between the first output signal OUT and the second output signal OUTB to the operational amplifier 302. Thus, the sensing circuit 301 may generate the feedback signal VCMFB according to a distribution voltage formed by distributing a voltage level of at least one of the first and second output signals OUT and OUTB using the distribution resistance formed from the distribution resistances 311 and 312.

Figure 6:
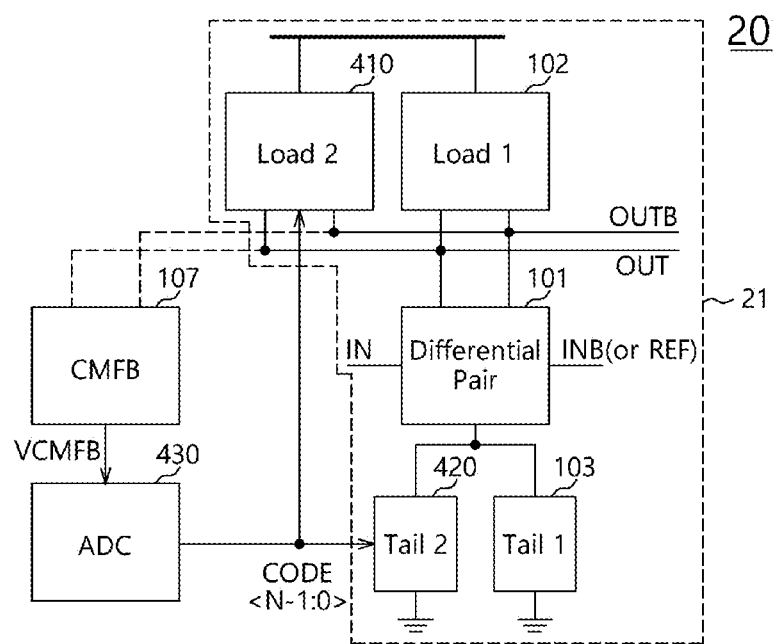
FIG. 6 is a diagram illustrating a configuration of an amplifier 10 in accordance with another embodiment.

As shown in FIG. 6, an amplifier 20 in accordance with another embodiment may include an amplifier circuit 21, a feedback circuit 107, and an analog-digital converter (ADC) 430.

The feedback circuit 107 may have the same configuration as that described with reference to FIGS. 1, 2, and 4.

The analog-digital converter 430 may convert a feedback signal VCMFB outputted from the feedback circuit 107 into a digital signal which is generated as the code signal CODE<N-1:0>.

In the amplifier circuit 21, other than a second load 410 and a second current sink 420, the remaining components, i.e., a differential pair circuit 101, a first load 102, and a first current sink 103, may have the same configurations as those of the embodiment of FIG. 1.

The second load 410 may include N unit loads (refer to '108' of FIG. 3) which are coupled in parallel with the first load 102.

As bits of a code signal CODE<N-1:0> in lieu of a feedback signal VCMFB are inputted in a one-to-one manner to gates of the respective transistors (refer to '141' and '142' of FIG. 3) of the N unit loads, it is possible to control the current driving force of the second load 410 in a digital manner.

The second current sink 420 may include N unit current sinks (refer to '109' of FIG. 3) which are coupled in parallel with the first current sink 103.

As bits of a code signal CODE<N-1:0> in lieu of a feedback signal VCMFB are inputted in a one-to-one manner to gates of the respective transistors of the N unit current sinks, it is possible to control the current driving force of the second current sink 420 in a digital manner.

Figure 7:
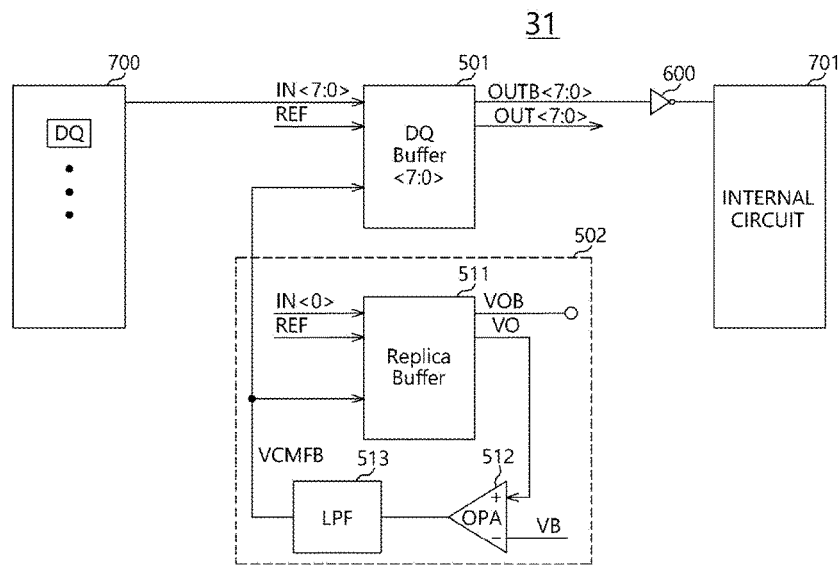
FIG. 7 is a diagram illustrating a configuration of a semiconductor apparatus 31 in accordance with an embodiment.

As shown in FIG. 7, a semiconductor apparatus 31 in accordance with an embodiment may include a plurality of data input/output terminals 700, a plurality of buffers 501, and a feedback circuit 502.

The plurality of data input/output terminals 700 may include a plurality of input/output pads DQ.

Each of the plurality of buffers 501 may include the configuration of the amplifier circuit 11 of FIG. 1.

The plurality of buffers 501 may generate output signals OUT<7:0> and OUTB<7:0> according to the reference voltage REF and respective input signals IN<7:0> inputted through the plurality of data input/output terminals 700. The plurality of buffers 501 may be coupled to respective data input/output terminals 700.

The output signals OUTB<7:0> of the plurality of buffers 501 may be provided to an internal circuit 701 of the semiconductor apparatus 31 through an array of inverters 600.

The internal circuit 701 may include a memory cell array region, and various circuit components coupled to a path through which the output signals OUTB<7:0> are transmitted to the memory cell array region.

As described with reference to FIGS. 1 to 6, in the plurality of buffers 501, the current driving forces of the load and at least one of the current sinks may be controlled according to a feedback signal VCMFB. Thus, any one of the plurality of current sinks may be controlled according to a voltage having a fixed level when any one of the plurality of buffers 501 is enabled, and the other current sinks may be controlled according to the feedback signal VCMFB.

The feedback circuit 502 may provide the feedback signal VCMFB, generated by directly or indirectly sensing the output signal of any one of the plurality of buffers 501, to the plurality of buffers 501 in common. In the case of FIG. 7, there is illustrated an example in which the feedback signal VCMFB is generated by indirectly sensing the output of any one of the plurality of buffers 501.

The feedback circuit 502 may include at least one replica buffer 511, at least one operational amplifier 512, and at least one filter (LPF) 513.

The replica buffer 511 may be configured by replicating a circuit configuration of any one of the plurality of buffers 501.

The replica buffer 511 may generate at least one of an output signal VO and VOB according to any one, e.g., IN<0>, of the plurality of input signal IN<7:0>, the reference voltage REF, and the feedback signal VCMFB.

The operational amplifier 512 may amplify and output an output signal VO of the replica buffer 511 according to a bias voltage VB.

The filter 513 may remove a high-frequency component of the output of the operational amplifier 12 and output it as the feedback signal VCMFB.

Figure 8:
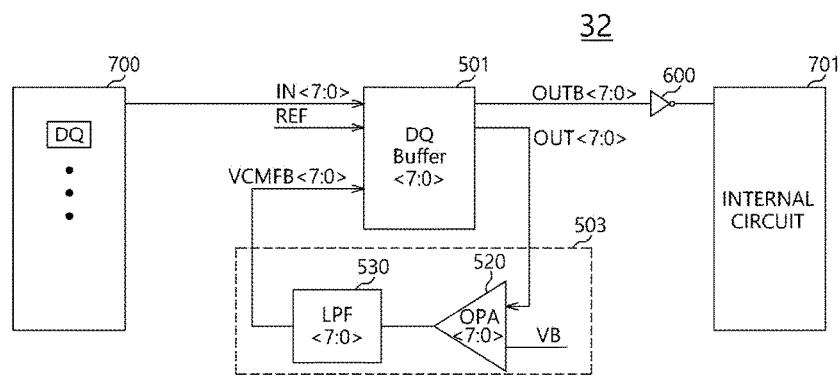
FIG. 8 is a diagram illustrating a configuration of a semiconductor apparatus 32 in accordance with another embodiment.

As shown in FIG. 8, a semiconductor apparatus 32 in accordance with an embodiment may include a plurality of data input/output terminals 700, a plurality of buffers 501, and a feedback circuit 503.

The plurality of data input/output terminals 700 may include a plurality of input/output pads DQ.

Each of the plurality of buffers 501 may include the configuration of the amplifier circuit 11 of FIG. 1.

The plurality of buffers 501 may generate output signals OUT<7:0> and OUTB<7:0> according to the reference voltage REF and respective input signals IN<7:0> inputted through the plurality of data input/output terminals 700. The plurality of buffers 501 may be coupled to respective data input/output terminals 700.

The output signals OUTB<7:0> of the plurality of buffers 501 may be provided to an internal circuit 701 of the semiconductor apparatus 32 through an array of inverters 600.

As described with reference to FIGS. 1 to 6, the current driving forces of the current sinks and the loads of the plurality of buffers 501 may be controlled according to a plurality of feedback signals VCMFB. Thus, any one of the plurality of current sinks may be controlled according to a voltage having a fixed level when the plurality of buffers 501 are enabled, and the other current sinks are controlled according to the plurality of feedback signals VCMFB.

The feedback circuit 503 may provide at least one feedback signal VCMFB, generated by directly or indirectly sensing the respective output signals of the plurality of buffers 501, to the plurality of buffers 501 in common. In the case of FIG. 8, there is illustrated an example in which the plurality of feedback signals VCMFB are generated by directly sensing the respective outputs of the plurality of buffers 501.

The feedback circuit 503 may include a plurality of operational amplifiers (OPA<7:0>) 520, and a plurality of filters (LPF<7:0>) 530.

The plurality of operational amplifiers 520 may amplify respective output signals OUT<7:0> and OUTB<7:0> of the plurality of buffers 501 according to a bias voltage VB and output the amplified output signals.

The plurality of filters 530 may remove respective high-frequency components of the outputs of the plurality of operational amplifiers 520 and output the result as the plurality of feedback signals VCMFB<7:0>.

While various embodiments have been described above, it will be understood by those skilled in the art that the embodiments described are examples only. Accordingly, the data storage device and the operating method thereof described herein should not be limited based on the described embodiments.

What is claimed is:

1. An amplifier comprising:
a differential pair circuit configured to generate an output signal according to a first input signal and a second input signal;
a plurality of loads coupled between a power supply terminal and the differential pair circuit;
a plurality of current sinks coupled between a ground terminal and the differential pair circuit; and
a feedback circuit configured to sense a level of the output signal and generate a feedback signal,
wherein at least one of the plurality of current sinks is controlled according to the feedback signal,
wherein at least one of the plurality of loads is controlled according to the feedback signal.

2. The amplifier according to claim 1, wherein any one of the plurality of current sinks is controlled according to a voltage having a fixed level when the amplifier is enabled.

3. The amplifier according to claim 1, wherein the plurality of current sinks are configured to have different current driving forces.

4. The amplifier according to claim 1, wherein the plurality of loads are configured to have different current driving forces.

5. The amplifier according to claim 1,
wherein any one of the first input signal and the second input signal is a reference voltage, and
wherein the feedback circuit includes a distribution resistance and is configured to generate the feedback signal according to a distribution voltage formed by distributing a voltage level of the output signal using the distribution resistance.

6. The amplifier according to claim 1,
wherein the first input signal and the second input signal are differential input signals having opposite phases, and
wherein the feedback circuit is a replica circuit formed by replicating the differential pair circuit and the plurality of loads, and is configured to generate the feedback signal according to an output voltage of the replica circuit.

7. The amplifier according to claim 6, wherein the feedback circuit further comprises an operational amplifier configured to generate the feedback signal according to a bias voltage and an output of the replica circuit.

8. The amplifier according to claim 1, further comprising an analog-digital converter configured to generate a code signal by converting the feedback signal into a digital signal,
wherein at least one of the plurality of current sinks is controlled according to the code signal.

9. A semiconductor apparatus comprising:
a plurality of data input/output terminals;
a plurality of buffers coupled to the respective data input/output terminals; and
a feedback circuit configured to sense a level of any one output signal of the plurality of buffers and generate a feedback signal,
wherein at least one of a plurality of current sinks of each of the plurality of buffers is controlled according to the feedback signal,
wherein the feedback circuit is a replica circuit formed by replicating any one of the plurality of buffers and is configured to generate the feedback signal according to an output voltage of the replica circuit and provide the feedback signal to the plurality of buffers in common.

10. The semiconductor apparatus according to claim 9, wherein the plurality of buffers comprise:
a differential pair circuit configured to generate an output signal according to an input signal inputted through the plurality of data input/output terminals; and
the plurality of current sinks coupled between a ground terminal and the differential pair circuit.

11. The semiconductor apparatus according to claim 10, wherein any one of the plurality of current sinks is controlled according to a voltage having a fixed level when any one of the plurality of buffers is enabled, and the other current sinks are controlled according to the feedback signal.

12. The semiconductor apparatus according to claim 9,
wherein the feedback circuit further comprises an operational amplifier configured to generate the feedback signal by amplifying an output voltage of the replica circuit according to a bias voltage.

13. The semiconductor apparatus according to claim 9,
wherein the feedback circuit directly receives each of the output signals of the plurality of buffers, and
wherein the feedback circuit comprises a plurality of operational amplifiers configured to generate a plurality of feedback signals by amplifying respective output signals of the plurality of buffers according to a bias voltage.

14. A semiconductor device comprising:
a plurality of data input/output terminals;
a plurality of buffers coupled to the respective data input/output terminals; and
a feedback circuit configured to sense levels of respective output signals of the plurality of buffers and generate a plurality of feedback signals,
wherein at least one of a plurality of current sinks of each of the plurality of buffers is controlled according to any one of the plurality of feedback signals,
wherein the feedback circuit directly receives each of output signals of the plurality of buffers, and
wherein the feedback circuit comprises a plurality of operational amplifiers configured to generate a plurality of feedback signals by amplifying respective output signals of the plurality of buffers according to a bias voltage.

15. The semiconductor apparatus according to claim 14, wherein the plurality of buffers comprise:
a differential pair circuit configured to generate an output signal according to an input signal inputted through the plurality of data input/output terminals; and
the plurality of current sinks coupled between a ground terminal and the differential pair circuit.

16. The semiconductor apparatus according to claim 14, wherein any one of the plurality of current sinks is controlled according to a voltage having a fixed level when the plurality of buffers are enabled, and the other current sinks are controlled according to any one of the plurality of feedback signals.

* * * * *